United States Patent
Hu et al.

(10) Patent No.: US 11,094,613 B2
(45) Date of Patent: Aug. 17, 2021

(54) SEMICONDUCTOR STRUCTURE AND MANUFACTURING METHOD THEREOF

(71) Applicant: Taiwan Semiconductor Manufacturing Co., Ltd., Hsinchu (TW)

(72) Inventors: Chih-Chia Hu, Taipei (TW); Hsien-Wei Chen, Hsinchu (TW); Ming-Fa Chen, Taichung (TW); Sen-Bor Jan, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/547,606

(22) Filed: Aug. 22, 2019

(65) Prior Publication Data

US 2021/0057309 A1 Feb. 25, 2021

(51) Int. Cl.
*H01L 23/48* (2006.01)
*H01L 23/522* (2006.01)
(Continued)

(52) U.S. Cl.
CPC ...... *H01L 23/481* (2013.01); *H01L 21/76898* (2013.01); *H01L 23/3171* (2013.01);
(Continued)

(58) Field of Classification Search
None
See application file for complete search history.

(56) References Cited

U.S. PATENT DOCUMENTS 8,993,380 B2 3/2015 Hou et al.
9,281,254 B2 3/2016 Yu et al.
(Continued)

FOREIGN PATENT DOCUMENTS

TW 201919186 5/2019
TW 201926496 7/2019

OTHER PUBLICATIONS

"Office Action of Taiwan Counterpart Application", dated May 15, 2020, p. 1-p. 9.

*Primary Examiner* — Alexander G Ghyka
(74) *Attorney, Agent, or Firm* — JCIPRNET

(57) ABSTRACT

A semiconductor structure and the manufacturing method thereof are provided. A semiconductor structure includes a semiconductor substrate, a plurality of interconnecting layers, a first connector, and a second connector. The semiconductor substrate includes a plurality of semiconductor devices therein. The interconnecting layers are disposed over the semiconductor substrate and electrically coupled to the semiconductor devices. The first connector is disposed over the plurality of interconnecting layers and extends to be in contact with a first level of the plurality of interconnecting layers. The second connector is disposed over the plurality of interconnecting layers and substantially leveled with the first connector. The second connector extends further than the first connector to be in contact with a second level of the plurality of interconnecting layers between the first level of the plurality of interconnecting layers and the semiconductor substrate, and the first connector is wider than the second connector.

20 Claims, 13 Drawing Sheets

(51) Int. Cl.
*H01L 23/528* (2006.01)
*H01L 21/768* (2006.01)
*H01L 23/00* (2006.01)
*H01L 23/31* (2006.01)

(52) U.S. Cl.
CPC ...... H01L 23/5226 (2013.01); H01L 23/5283 (2013.01); H01L 24/09 (2013.01); *H01L 2224/02373* (2013.01); *H01L 2224/02379* (2013.01); *H01L 2224/02381* (2013.01)

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2013/0095650 A1* | 4/2013 | Shimomura ........ H01L 29/4238 438/618 |
| 2014/0327151 A1 | 11/2014 | Yang et al. |
| 2014/0363968 A1* | 12/2014 | Yang .................. B81C 1/00238 438/624 |
| 2015/0235949 A1 | 8/2015 | Yu et al. |
| 2017/0317011 A1* | 11/2017 | Lin .................. H01L 21/76816 |
| 2019/0198426 A1 | 6/2019 | Choi et al. |
| 2019/0267319 A1* | 8/2019 | Sharma ................ H01L 23/525 |

* cited by examiner

SEMICONDUCTOR STRUCTURE AND MANUFACTURING METHOD THEREOF

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area. For example, the area occupied by integrated components is proximate to the surface of a semiconductor wafer; however, there are physical limitations to an achievable density in two-dimensional (2D) integrated circuit formation. For example, one of these limitations comes from the significant gains in the number and length of interconnections between semiconductor devices as the number of semiconductor devices increases. As the existing integrated circuit design rules require a decreasing pitch for laying out conductive wirings in interconnection structures of a semiconductor device, the line and spacing of the interconnection structures becomes very small as well. This causes the parasitic capacitance between conductive wirings in the interconnection structures to be high. As a result, the resistance-capacitance (RC) delay of the integrated circuits increases. Moreover, with a smaller spacing between the conductive wirings, leakage current may become significant. Accordingly, there is continuous effort in developing new mechanisms of forming semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
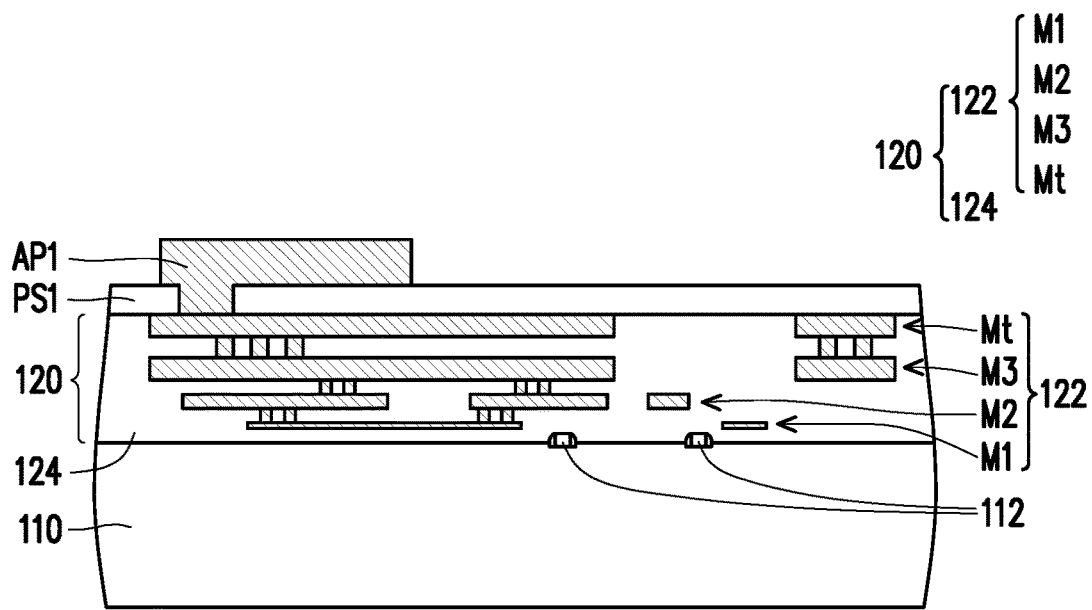
FIG. 1A to FIG. 1C are schematic cross-sectional views showing various stages in a manufacturing method of a first tier of a semiconductor structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
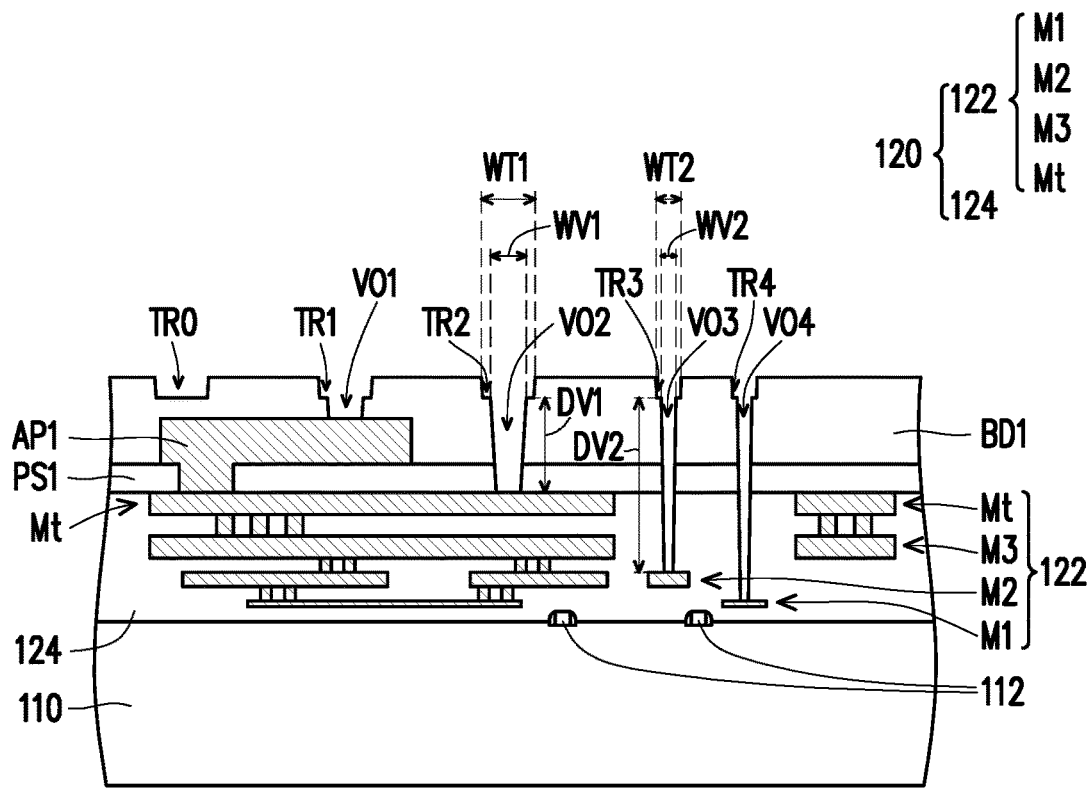
Figure 1C:
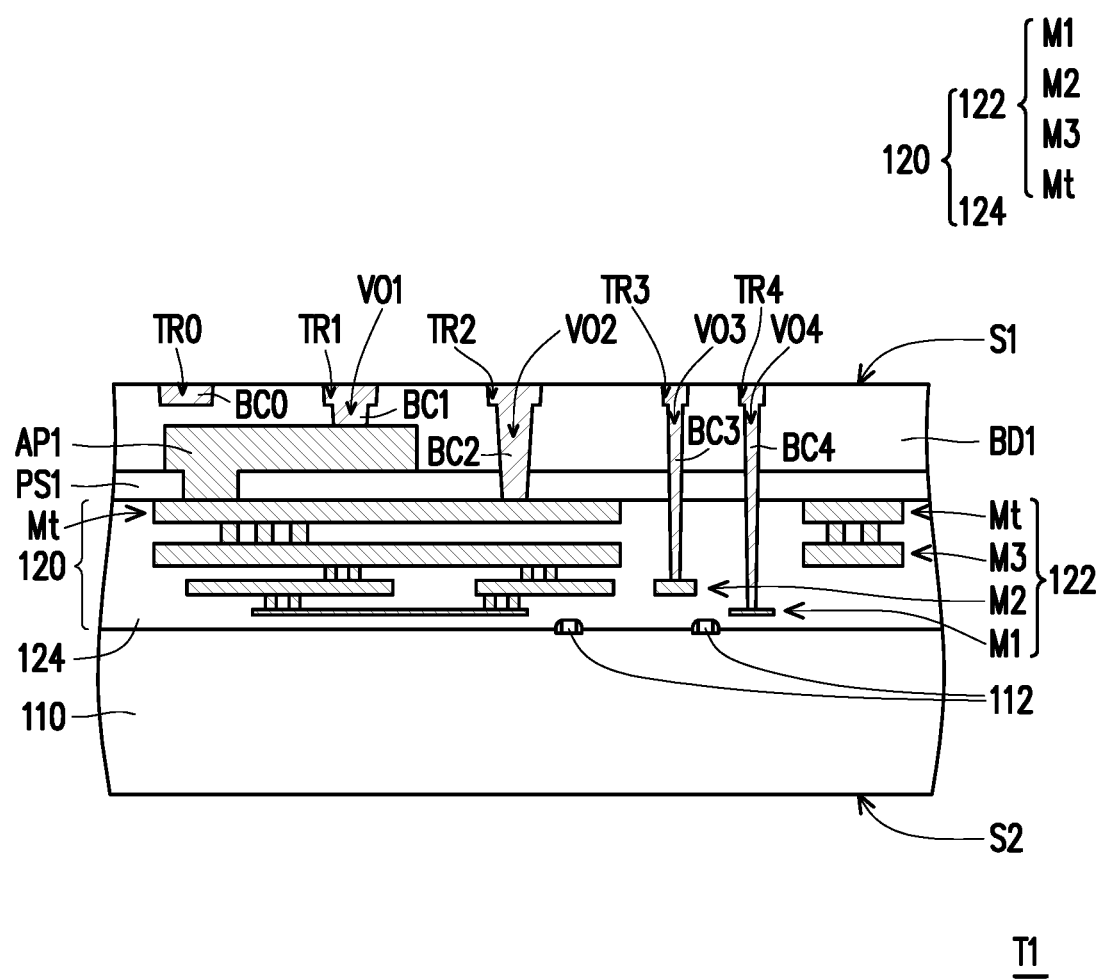

FIG. 1A to FIG. 1C are schematic cross-sectional views showing various stages in a manufacturing method of a first tier of a semiconductor structure according to some embodiments of the present disclosure. Referring to FIG. 1A, a first interconnect structure 120 is formed on a first semiconductor substrate 110. For example, the first semiconductor substrate 110 includes a bulk semiconductor, a semiconductor-on-insulator (SOI) substrate, other supporting substrate (e.g., quartz, glass, etc.), combinations thereof, or the like, which may be doped or undoped. In some embodiments, the first semiconductor substrate 110 includes an elementary semiconductor (e.g., silicon or germanium in a crystalline, a polycrystalline, or an amorphous structure, etc.), a compound semiconductor (e.g., silicon carbide, gallium arsenide, gallium phosphide, indium phosphide, indium arsenide, and/or indium antimonide, etc.), an alloy semiconductor (e.g., silicon-germanium (SiGe), gallium arsenide phosphide (GaAsP), aluminum indium arsenide (AlInAs), aluminium gallium arsenide (AlGaAs), gallium indium arsenide (GaInAs), gallium indium phosphide (GaInP), etc.), combinations thereof, or other suitable materials. For example, the compound semiconductor substrate may have a multilayer structure, or the substrate may include a multilayer compound semiconductor structure. In some embodiments, the alloy SiGe is formed over a silicon substrate. In other embodiments, a SiGe substrate is strained. In some embodiments, the first semiconductor substrate 110 is a device wafer. For example, the first semiconductor substrate 110 includes a plurality of first semiconductor devices 112 formed therein. The first semiconductor devices 112 may be or may include active devices (e.g., transistors, diodes, etc.) and/or passive devices (e.g., capacitors, resistors, inductors, etc.), or other suitable electrical components.

The first semiconductor substrate 110 may include circuitry (not shown) formed in a front-end-of-line (FEOL), and the first interconnect structure 120 may be formed in a back-end-of-line (BEOL). In some embodiments, the first interconnect structure 120 includes an inter-layer dielectric (ILD) layer formed over the first semiconductor substrate 110, and an inter-metallization dielectric (IMD) layer formed over the ILD layer. In some embodiments, the ILD layer and the IMD layer are formed of a low-K dielectric material, such as phosphosilicate glass (PSG), borophosphosilicate glass (BPSG), SiOxCy, Spin-On-Glass, Spin-On-Polymers, silicon carbon material, compounds thereof, composites thereof, combinations thereof, or the like. The ILD layer and the IMD layer may include any suitable number of dielectric material layers which is not limited thereto.

In some embodiments, the first interconnect structure 120 interconnects the first semiconductor devices 112. For example, the first interconnect structure 120 includes at least one first dielectric layer 124 disposed on the first semiconductor substrate 110, and a plurality of first interconnecting layers 122 embedded in the first dielectric layers 124. For example, each of the first interconnecting layers 122 includes conductive lines, conductive pads, conductive vias, etc. A material of the first interconnecting layers 122 may include copper or copper alloys, although other metals (e.g., aluminum, silver, gold, and combinations thereof) may also be used. In some embodiments, two or more layers of conductive lines of the first interconnecting layers 122 are vertically interconnected by conductive vias of the first interconnecting layers 122 and embedded in the first dielectric layer 124. The first interconnecting layers 122 of the first interconnect structure 120 disposed over the first semiconductor substrate 110 may be electrically coupled to the first semiconductor devices 112 formed in and/or on the first semiconductor substrate 110 to one another and to external components.

For example, the first interconnecting layers 122 of the first interconnect structure 120 includes a bottom interconnecting layer M1, a top interconnecting layer Mt (i.e. a first level of the plurality of interconnecting layers), and intermediate level(s) of the interconnecting layers therebetween (e.g., a second-level interconnecting layer M2 immediately over the bottom interconnecting layer M1, a third-level interconnecting layer M3 immediately over the second-level interconnecting layer M2, and the like). For ease of description, the term "top" is used herein to refer to the interconnecting layer that is most distal to the first semiconductor substrate 110, relative to other interconnecting layers, and the term "bottom" is used to refer to the interconnecting layer that is most proximal to the first semiconductor substrate 110, relative to other interconnecting layers. It should be noted that a four-level interconnecting layer structure illustrated in the figures is merely an example, the first interconnect structure 120 may include more or less interconnecting layers depending on requirements of circuit design.

In some embodiments, at least one first passivation layer PS1 is disposed over the top interconnecting layer Mt of the first interconnect structure 120. In some embodiments, the first passivation layer PS1 is a non-low-k dielectric layer. For example, the first passivation layer PS1 includes silicon oxide, silicon nitride, un-doped silicate glass, polyimide, or the like. Alternatively, the first passivation layer PS1 is omitted. In some embodiments, a first contact pad AP1 is formed on the first passivation layer PS1, and the first contact pad AP1 may be in electrical contact with the top interconnecting layer Mt through conductive vias. A material of the first contact pad AP1 may include aluminum, but other suitable conductive materials (e.g., copper) may be used. It should be noted that the structure described in conjunction with FIG. 1A is merely an example. The structure shown in FIG. 1A may include more elements, and other configurations are possible.

Referring to FIG. 1B and FIG. 1C, a first surface dielectric layer BD1 and a plurality of first bonding connectors (e.g., BC0, BC1, BC2, BC3, and BC4) are formed. For example, a surface dielectric material is formed over the first passivation layer PS1 and covers the first contact pad AP1. The surface dielectric material may be or may include an oxynitride layer (e.g., a silicon oxynitride (SiON) layer), or any suitable dielectric material such as silicon oxide ($SiO_2$), silicon nitride (SiN), or the like. Next, the surface dielectric material is patterned to form the first surface dielectric layer BD1 using a damascene technique or other suitable process. In some embodiments, a dual damascene process is performed on the surface dielectric material to form the first surface dielectric layer BD1 with a plurality of trenches (e.g., TR0, TR1, TR2, TR3, and TR4) and via openings (e.g., VO1, VO2, VO3, and VO4) as shown in FIG. 1B. It should be appreciated that the dual damascene technique described in conjunction with FIG. 1B is merely an example, and a single damascene process or other suitable process may be used in other embodiments.

In some embodiments, the trenches are formed prior to the via openings. For example, an etching step is performed to remove portions of the surface dielectric material so as to form the trenches TR0, TR1, TR2, TR3, and TR4. At this stage, the underlying conductive features (e.g., the first contact pad AP1 and the first interconnecting layers 122) are not revealed by the surface dielectric material. The via openings VO1, VO2, VO3, and VO4 are then formed to expose the underlying conductive features at intended locations. The number of via openings may or may not correspond to the number of trenches. It should be appreciated that etch stop layer(s) (not shown) may be disposed in the first interconnect structure 120 or may be disposed between the surface dielectric material and the first interconnect structure 120. For example, during the process of forming trenches, the via openings VO1, VO2, VO3, and VO4 extend downwardly from the bottom of the corresponding trenches TR1, TR2, TR3, and TR4 until the underlying first contact pad AP1 and/or the interconnecting layers 122 are accessibly exposed. The trench TR0 may not correspond to any of via openings in a cross section, for example, the trench TR0 may be used for forming conductive lines or serving as dummy pads.

Some of the via openings (e.g., VO1) may extend downwardly to reach the first contact pad AP1 embedded in the surface dielectric material, so that at least a portion of the first contact pad AP1 is accessibly exposed by the trench TR1 and the via opening VO1 of the first surface dielectric layer BD1 for further electrical connection. In some embodiments, the trench TR1 and the corresponding via opening VO1 exposing the first contact pad AP1 is omitted. Some of the via openings (e.g., VO2) may pass through the first passivation layer PS1 to reach the top interconnecting layer Mt, so that at least a portion of the top interconnecting layer Mt is accessibly exposed by the trench TR2 and the via opening VO2. Some of the via openings (e.g., VO3 and VO4) may pass through the first passivation layer PS1 and extend into the first dielectric layers 124 of the first interconnect structure 120 to reach the bottom interconnecting layer M1 and/or any intermediate level of interconnecting layers (e.g., the second-level interconnecting layer M2 or the third-level interconnecting layer M3). In other embodiments, the via openings are formed prior to the trenches. Alternatively, the trenches and the via openings are formed during the same process using such as a half tone mask.

Continue to FIG. 1B, the trenches and/or via openings may be tapered from the top to the bottom. Alternatively, the surface dielectric layer BD1 includes substantially vertical sidewalls at the locations where the trenches and/or via openings are formed. In some embodiments, a top width (or diameter) of each trench is greater than a top width (or diameter) of the corresponding via opening. The dimensions of the trenches and the corresponding via openings may be sized depending on the functions of the subsequently formed first bonding connectors and the process requirements. In some embodiments, the top widths of one of the trenches and the corresponding via are different from those of another one of the trenches and the corresponding via.

For example, the top width WT1 of the trench TR2 is greater than the top width WT2 of the trench TR3. In some embodiments, the top width of the trench TR0 and/or TR1 may be substantially the same or similar to the top width WT1 of the trench TR2. In some embodiments, the top width WT1 of the trench TR2 ranges from about 0.4 μm to about 5 μm. In some embodiments, the top width of the trench TR4 may be substantially the same or similar to the top width WT2 of the trench TR3. In some embodiments, the top width WT2 of the trench TR3 ranges from about 0.36 μm to about 4.5 μm. The top width WV1 of the via opening VO2 corresponding to the trench TR2 may be greater than the top width WV2 of the via opening VO3 corresponding to the trench TR3. In some embodiments, the top width of the via opening VO1 may be substantially the same or similar to the top width WV1 of the via opening VO2. In some embodiments, the top width WV1 of the via opening VO2 ranges from about 0.36 μm to about 2 μm. In some embodiments, the top width of the via opening VO4 may be substantially the same or similar to the top width WV2 of the via opening VO3. In some embodiments, the top width WV2 of the via opening VO3 ranges from about 0.1 μm to about 2 μm. It should be noted that the layout of the first interconnect structure 120 shown in the figures is merely an example, the top interconnecting layer Mt or the underlying interconnecting layers may be distributed between the via openings VO2 and VO3 and/or the via openings VO3 and VO4. Since the width of the via opening VO3 and/or VO4 is narrower than the width of the via opening VO2, the distribution layout area of the first interconnecting layers 122 may extend more widely and feasibly.

Still referring to FIG. 1B, in some embodiments, the opening depth (or height) DV2 of the via opening VO3 is greater than opening depth DV1 of the via opening VO2, so that the via opening VO3 extends further than the via opening VO2 to expose the second-level interconnecting layer M2 below the top interconnecting layer Mt. The via opening VO1 exposing the first contact pad AP1 may have a smallest opening depth among the via openings VO1, VO2, VO3, and VO4. It should be noted that the via openings VO2 and VO3 illustrated in FIG. 1B are merely an example, the via openings VO2 and VO3 having narrower widths may extend to reach any level of the first interconnecting layers 122 underneath the top interconnecting layer Mt (e.g., the bottom interconnecting layer M1, the second-level interconnecting layer M2, the third-level interconnecting layer M3). In some embodiments, the via openings VO2 and/or VO3 having narrower widths may extend downwardly to expose metal gates or tungsten contacts in the first semiconductor devices 112. The dimensions of the via openings VO2 and VO3 may be the same or similar, which is not limited thereto. For example, the via openings VO2 and VO3 may reach the same level or different levels of the first interconnecting layers 122 underneath the top interconnecting layer Mt. Alternatively, one of the via openings VO2 and VO3 is omitted. The number of the via openings having narrower widths construe no limitation in the disclosure. In some embodiments, an aspect ratio (opening depth DV2/top width WV2) of the via opening VO3 is greater than an aspect ratio (opening depth DV1/top width WV1) of the via opening VO2. In some embodiments, the aspect ratio (opening depth DV2/top width WV2) of the via opening VO3 is about 0.3 to about 20. The aspect ratio (opening depth DV1/top width WV1) of the via opening VO2 may be greater than the aspect ratio of the via opening VO1 exposing the first contact pad AP1.

Continue to FIG. 1C, after forming the first surface dielectric layer BD1, conductive materials are formed in the trenches (TR0, TR1, TR2, TR3, and TR4) and the via openings (VO1, VO2, VO3, and VO4) to form the first bonding connectors (BC0, BC1, BC2, BC3, and BC4). In an embodiment, the method of forming the first bonding connectors (BC0, BC1, BC2, BC3, and BC4) includes at least the following steps. For example, a diffusion barrier layer (not shown) is conformally formed on the first surface dielectric layer BD1 and covers sidewalls and bottoms of the trenches (TR0, TR1, TR2, TR3, and TR4) and the via openings (VO1, VO2, VO3, and VO4) so as to be in physical and electrical contact with the first contact pad AP1 and the interconnecting layers 122 exposed by the via openings (VO1, VO2, VO3, and VO4). The diffusion barrier layer may include barrier materials such as titanium, titanium nitride, tantalum, tantalum nitride, and combinations thereof, and may be formed using such as physical vapor deposition (PVD) or other suitable depositing process. Next, a seed layer (not shown) may be conformally formed on the diffusion barrier layer using sputtering, plating, or other suitable depositing process. For example, the seed layer may be a copper layer, a titanium/copper bilayer, or other suitable metal layer that aids in the formation of a thicker conductive material during subsequent processing steps. Subsequently, a conductive material (e.g., copper, aluminum, silver, gold, metal alloy, etc.) is formed in the trenches (TR0, TR1, TR2, TR3, and TR4) and via openings (VO1, VO2, VO3, and VO4) to form the first bonding connectors (BC0, BC1, BC2, BC3, and BC4) using plating, printing, or other suitable depositing process. Afterwards, excess conductive materials may be removed to form a planar surface using a planarization process such as a chemical mechanical polish (CMP). It should be noted that the first bonding connectors (BC0, BC1, BC2, BC3, and BC4) may be formed using other suitable techniques. Up to here, a first tier T1 of a semiconductor structure is substantially formed. In some embodiments, the first tier T1 of a semiconductor structure is viewed as a semiconductor die. In some embodiments, the foregoing manufacturing steps of the first tier T1 are performed at a wafer level, and the first tier T1 may be or may not be singulated into a plurality of semiconductor dies (or chips) before undergoing the next step (e.g., bonding).

Still referring to FIG. 1C, the first tier T1 includes a first surface S1 and a second surface S2 opposite to the first surface S1. The top surfaces of the first bonding connectors (BC0, BC1, BC2, BC3, and BC4) and the top surface of the first surface dielectric layer BD1 may be substantially leveled at the first surface S1. The first bonding connector BC0 of the first tier T1 may not be in contact with any of the underlying conductive features in a cross section as shown in FIG. 1C, for example, the first bonding connector BC0 serves as a metal line or a bonding pad. In some embodiments, the first bonding connector BC0 of the first tier T1 is a dummy connector or a dummy line which is electrically floating. In some embodiments, the first bonding connectors (e.g., BC1, BC2, BC3, and BC4) include trench portions (or pad portions) and via portions extending downwardly from the corresponding trench portions. The trench portions of the first bonding connectors (BC0, BC1, BC2, BC3, and BC4) may be substantially leveled. In some embodiments, the first bonding connectors (BC0, BC1, BC2, BC3, and BC4) are substantially coplanar with the first surface dielectric layer BD1. In some embodiments, the via portion of the first bonding connector BC1 is tapered from the trench portion of the first bonding connector BC1 to the first contact pad AP1, the via portion of the first bonding connector BC2 is tapered from the trench portion of the first bonding connector BC2 to the top interconnecting layer Mt, and the via portions of the first bonding connectors BC3 and BC4 are tapered from the corresponding trench portions of the first bonding connectors BC3 and BC4 to the bottom interconnecting layer M1 and/or the intermediate level of the first interconnecting layers 122. In some embodiments, the via portion of the first bonding connector BC3 or BC4 is narrower and longer than the via portion of the first bonding connector BC1 or BC2. In some embodiments, a dimension of one of the first bonding connector (e.g., BC1 or BC2) is at least about four times greater than that of another one of the first bonding connector (e.g., BC3 or BC4).

In some embodiments, the power routing is made to at least the top interconnecting layer Mt of the first interconnect structure 120 or some of the first interconnecting layers 122 near the first surface dielectric layer BD1. For example, the first bonding connector BC2 directly connected to the top interconnecting layer Mt may serve as a power connector for power distribution. In some embodiments, the first bonding connector BC1 connected to the top interconnecting layer Mt through the first contact pad AP1 may also serve as a power connector. In some embodiments, the signal routing is made to the bottom interconnecting layer M1 and/or any intermediate level below the top interconnecting layer Mt, and the first bonding connectors BC3 and BC4 connected to the first interconnecting layers 122 underneath the top interconnecting layer Mt may serve as signal connectors for electrical signal distribution. Since the first bonding connectors (e.g., BC3 and BC4) connected to the signal routing are finer than the first bonding connectors (e.g., BC1 and BC2) connected to the power routing, the power routing may be extended and distributed without compromising other characteristics of the integrated circuits. The line and spacing of the top interconnecting layer Mt may be increased due to the finer first bonding connectors (e.g., BC3, BC4), so that the reduction in resistance-capacitance (RC) delay may be achieved and electrical performance may be improved. It should be appreciated that the actual dimensions of the first bonding connectors depend upon the process technology node employed, the number of first bonding connectors required, whether power or a signal is being routed through a particular bonding connector, and other factors based on product demands.

Figure 2A:
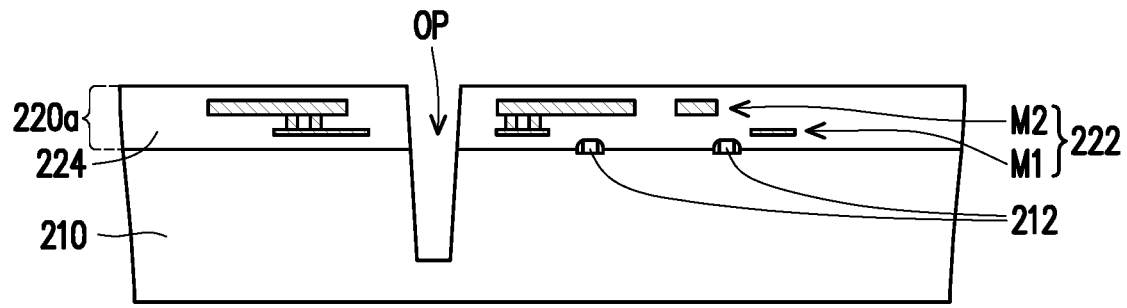
FIG. 2A to FIG. 2D are schematic cross-sectional views showing various stages in a manufacturing method of a second tier of a semiconductor structure according to some embodiments of the present disclosure.
Figure 2B:
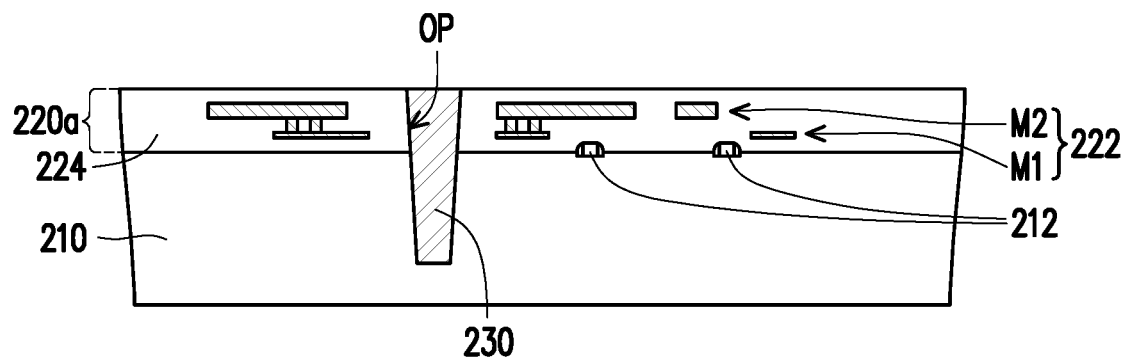

FIG. 2A to FIG. 2D are schematic cross-sectional views showing various stages in a manufacturing method of a second tier of a semiconductor structure according to some embodiments of the present disclosure. Referring to FIG. 2A and FIG. 2B, a first portion 220a of a second interconnect structure 220 (labeled in FIG. 2C) is formed on a second semiconductor substrate 210. The second semiconductor substrate 210 may include a plurality of second semiconductor devices 212 formed therein. The second semiconductor substrate 210 and the second semiconductor devices 212 may be the same or similar to the first semiconductor substrate 110 and the first semiconductor devices 112 described in FIG. 1A, so the detailed descriptions are not repeated herein for brevity. The first portion 220a of the second interconnect structure 220 may be similar to the lower part of the first interconnect structure 120 described in FIG. 1A. For example, the first portion 220a includes a portion of a second dielectric layer 224 and a portion of the second interconnecting layers 222 embedded in the portion of a second dielectric layer 224. For example, the second interconnecting layers 222 in the first portion 220a includes the bottom interconnecting layer M1 electrically coupled to the second semiconductor devices 212, and the second-level interconnecting layer M2 electrically connected to the bottom interconnecting layer M1. It should be noted that although a two-level interconnecting structure of the first portion 220a is illustrated in FIG. 2A and FIG. 2B, more or less interconnecting layer(s) may be formed in the first portion 220a. The materials of the first portion 220a may be similar to those of the first interconnect structure 120 described in FIG. 1A, and the detailed descriptions are omitted for brevity.

Continue to FIG. 2A, an opening OP is formed on the first portion 220a and extends downwardly into the second semiconductor substrate 210 using lithography and/or etching or other suitable techniques. The opening OP may include a circular, oval, square, rectangular, polygon, or other shapes in a top view (not shown). In some embodiments, the opening OP is tapered from the first portion 220a to the second semiconductor substrate 210. Alternatively, the opening OP may have substantially vertical sidewall(s) depending on the forming process. The second semiconductor devices 212 and the second interconnecting layers 222 may be located away from the opening OP. At this stage, the opening OP does not penetrate through the second semiconductor substrate 210. In other embodiments, the opening OP may penetrate through the second semiconductor substrate 210.

Subsequently, as shown in FIG. 2B, conductive materials may be formed in the opening OP to form a through semiconductor via (TSV) 230 using plating, printing, or other suitable depositing process. For example, the conductive materials may be formed by depositing one or more diffusion barrier layer(s) or isolation layer(s), depositing a seed layer, and depositing a conductive material (e.g., tungsten, titanium, aluminum, copper, any combinations thereof and/or the like) into the opening OP through plating or other suitable process. In some embodiments, excess materials formed on the first portion 220a are removed using a planarization process (e.g., a CMP process), so that the TSV 230 is substantially leveled with the first portion 220a (e.g., top surface of the dielectric layer 224 of the first portion 220a).

Figure 2C:
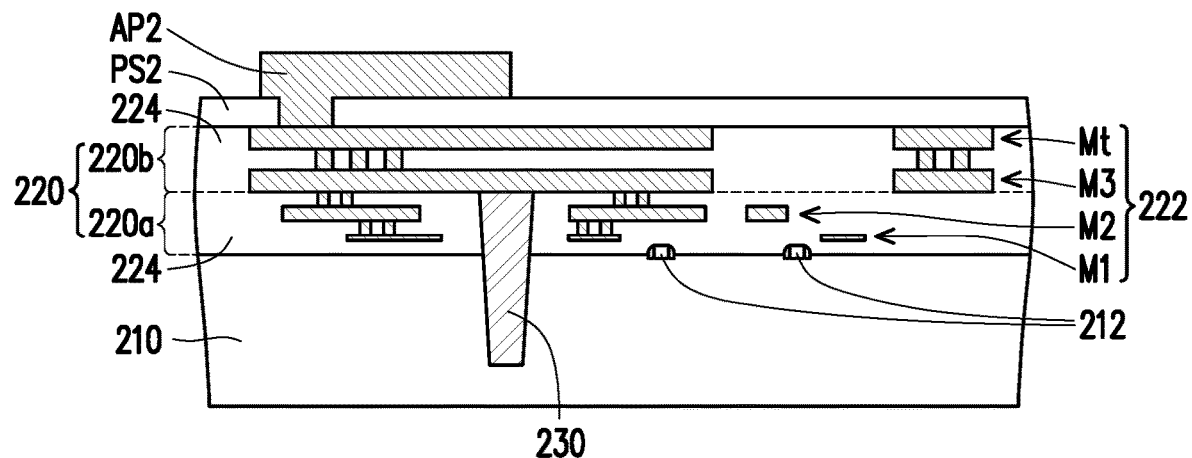

Referring to FIG. 2C, a second portion 220b of the second interconnect structure 220 is formed on the first portion 220a and the TSV 230. The second portion 220b of the second interconnect structure 220 may be similar to the upper part of the first interconnect structure 120 described in FIG. 1A. For example, the second portion 220b includes a portion of second dielectric layer 224 and a portion of the second interconnecting layers 222 embedded in the portion of second dielectric layer 224. For example, the portion of the second interconnecting layers 222 in the second portion 220b includes the third-level interconnecting layer M3 embedded in the portion of second dielectric layer 224 and electrically connected to the second-level interconnecting layer M2 and the TSV 230, and the top interconnecting layer Mt electrically connected to the third-level interconnecting layer M3 and embedded in the portion of second dielectric layer 224. It should be appreciated that the second portion 220b of the second interconnect structure 220 may include more than one interconnecting layers between the first portion 220a and the top interconnecting layer Mt. The materials of the second portion 220b may be similar to those of the first portion 220a, and the detailed descriptions are omitted for brevity.

In the illustrated embodiment, the TSV 230 is in physical and electrical contact with the intermediate level of the second interconnecting layers 222. In other embodiments, the TSV 230 is in physical and electrical contact with the top interconnecting layer Mt or the bottom interconnecting layer M1 of the second interconnect structure 220. It should be noted that although only one TSV 230 is illustrated in the figures, more than one TSVs 230 may be formed depending on the design requirements. In other embodiments, the TSV 230 may be formed using a via-first process. For example, the TSV 230 is formed before the formation of the second interconnect structure 220, so that the TSV 230 only extends to the ILD layer of the second interconnect structure 220 which covers the second semiconductor devices 212, but not into the IMD layers of the second interconnect structure 220. Alternatively, the TSV 230 may be formed using a via-last process (e.g., forming the TSV after the formation of the second interconnect structure 220).

After forming the second portion 220b of the second interconnect structure 220, a second passivation layer PS2 is formed on the second portion 220b of the second interconnect structure 220, and a second contact pad AP2 is formed on the second passivation layer PS2 and electrically coupled to the underlying second interconnecting layers 222 of the second interconnect structure 220. The TSV 230 and the second contact pad AP2 may be electrically coupled through the second interconnecting layers 222. The materials of the second passivation layer PS2 and the second contact pad AP2 may be similar to those of the first passivation layer PS1 and the first contact pad AP1 described in FIG. 1A, so the detailed descriptions are omitted for brevity.

Figure 2D:
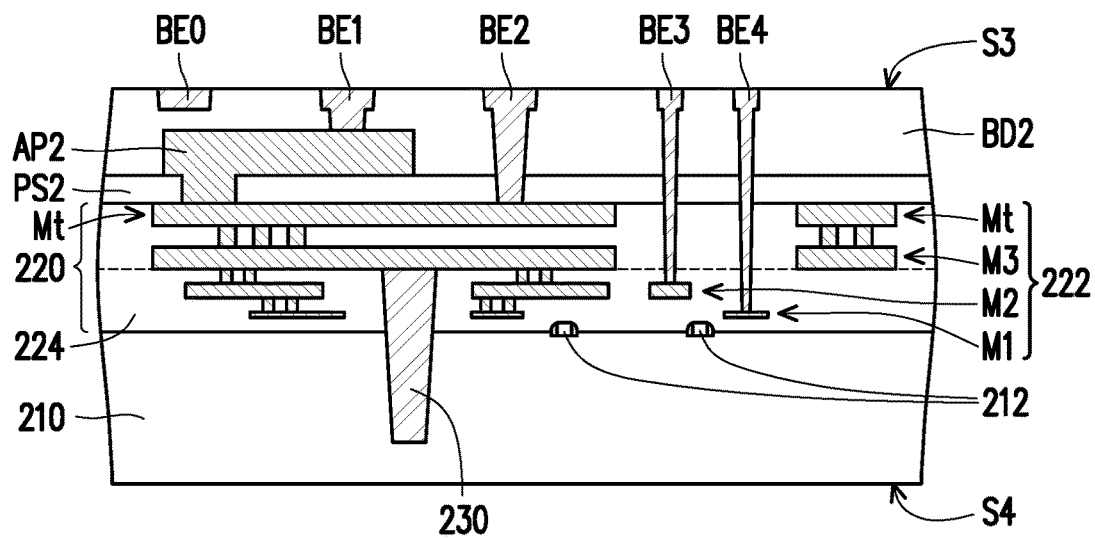

Referring to FIG. 2D, a second surface dielectric layer BD2 and a plurality of second bonding connectors (e.g., BE0, BE1, BE2, BE3, and BE4) are formed on the second passivation layer PS1 and the second contact pad AP1. Up to here, a second tier T2 of a semiconductor structure is formed. In some embodiments, the second tier T2 of a semiconductor structure is viewed as a semiconductor die. The forming process and materials of the second surface dielectric layer BD2 and the second bonding connectors (BE0, BE1, BE2, BE3, and BE4) may be similar to those of the first surface dielectric layer BD1 and the first bonding connectors (BC0, BC1, BC2, BC3, and BC4) described in FIG. 1B and FIG. 1C, so the detailed descriptions are not repeated herein for brevity.

In some embodiments, some of the second bonding connectors (e.g., BE3, BE4), which extend into the second interconnect structure 220 to be in physical and electrical contact with the intermediate level(s) of interconnecting layers (e.g., the second-level interconnecting layer M2) or the bottom interconnecting layer M1, may be finer than other second bonding connectors (e.g., BE1, BE2), which are in physical and electrical contact with the top interconnecting layer Mt and/or the second contact pad AP2. In some embodiments, the dimensions of the second bonding connectors (BE0, BE1, BE2, BE3, and BE4) correspond to those of the first bonding connectors (BC0, BC1, BC2, BC3, and BC4), respectively. The second tier T2 may include a third surface S3 and a fourth surface S4 opposite to each other. The second bonding connectors (BE0, BE1, BE2, BE3, and BE4) and the second surface dielectric layer BD2 may be substantially leveled at the third surface S3. In some embodiments, with the formation of the second bonding connectors (e.g., BC1, BC2, BC3, and BC4), the power or signal introduced to TSV 230 may be provided through the second bonding connectors that have different lengths. In some embodiments, compared to conventional structures, the paths to conductive features that are on different interconnecting layers are significantly shortened in the second tier T2, so that the power connection efficiency is improved. The TSV 230 may be or may not be accessibly revealed at the fourth surface S4 at this stage. The foregoing manufacturing steps of the second tier T2 may be performed at a wafer level, and the second tier T2 may be or may not be singulated into a plurality of semiconductor dies (or chips) before undergoing the next step (e.g., bonding).

Figure 3A:
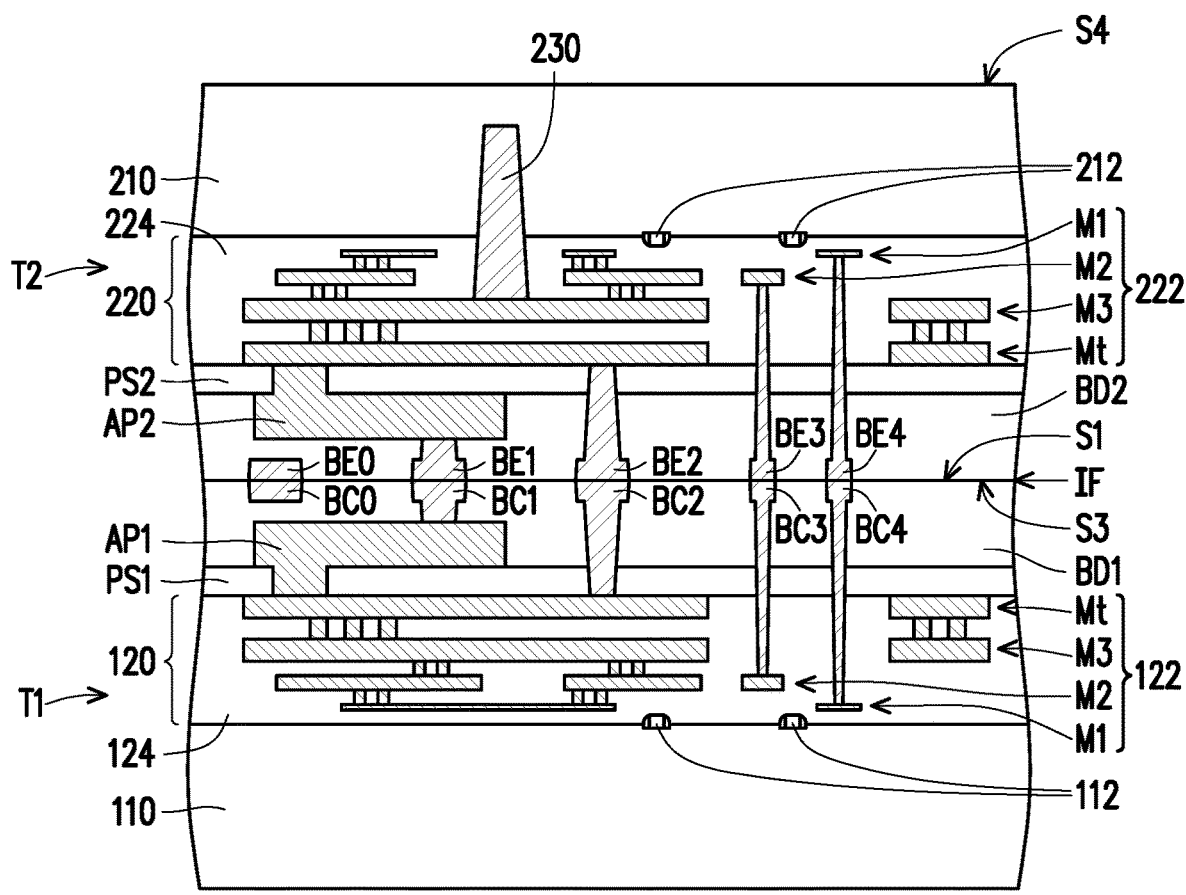
FIG. 3A to FIG. 3D are schematic cross-sectional views showing various stages in a manufacturing method of a semiconductor structure according to some embodiments of the present disclosure.

FIG. 3A to FIG. 3D are schematic cross-sectional views showing various stages in a manufacturing method of a semiconductor structure according to some embodiments of the present disclosure. Referring to FIG. 3A, the first tier T1 and the second tier T2 are bonded together in a face-to-face configuration. For example, the first tier T1 and the second tier T2 are arranged with the first surface S1 of the first tier T1 and the third surface S3 of the second tier T2 facing each other and are bonded. In some embodiments, a bonding interface IF between the first tier T1 and the second tier T2 includes dielectric-to-dielectric bonding (e.g., oxide-to-oxide bonding), metal-to-metal bonding (e.g., copper-to-copper bonding), metal-to-dielectric bonding (e.g., copper-to-oxide bonding), any combinations thereof, and/or the like.

In some embodiments, the first tier T1 and the second tier T2 are separately fabricated, and a hybrid bonding process is performed on the first tier T1 and the second tier T2. For example, to facilitate hybrid bonding, surface preparation for bonding surfaces (e.g., the first surface S1 of the first tier T1 and the third surface S3 of the second tier T2) is performed to remove particles thereon. The surface preparation may include surface cleaning and activation or other suitable process. In some embodiments, the top surfaces of the first bonding connectors (BC0, BC1, BC2, BC3, and BC4) and the second bonding connectors (BE0, BE1, BE2, BE3, and BE4) may be cleaned by wet cleaning before performing a bonding process. Not only particles are removed, but also native oxide formed on the top surfaces of the first bonding connectors (BC0, BC1, BC2, BC3, and BC4) of the first tier T1 and the second bonding connectors (BE0, BE1, BE2, BE3, and BE4) of the second tier T2 may be removed by chemicals used in the wet cleaning, for example. After cleaning, activation of the top surfaces of the first surface dielectric layer BD1 and the second surface dielectric layer BD2 may be performed for development of high bonding strength. In some embodiments, plasma activation may be performed to treat the top surfaces of the first surface dielectric layer BD1 and the second surface dielectric layer BD2.

In some embodiments, the first tier T1 is aligned with the second tier T2 and sub-micron alignment precision may be achieved. For example, each first bonding connector (BC0, BC1, BC2, BC3, and BC4) may be substantially aligned with the corresponding second bonding connector (BE0, BE1, BE2, BE3, and BE4). In some embodiments, some of first bonding connectors (e.g., BC1, BC2) severing as the power connectors of the first tier T1 are substantially aligned with those second bonding connectors (e.g., BE1, BE2) which also serve as the power connectors of the second tier T2. For example, the connections of the power in the first tier T1 and the second tier T2 have short paths, thereby reducing the resistances of the power paths. Some of first bonding connectors (e.g., BC3, BC4) severing as the signal connectors of the first tier T1 may be substantially aligned with those second bonding connectors (e.g., BE3, BE4) which also serve as the signal connectors of the second tier T2. Once the first tier T1 and the second tier T2 are aligned precisely, the first tier T1 or the second tier T2 is placed on and in contact with one another. When the activated top surface of the first surface dielectric layer BD1 of the first tier T1 is in contact with the activated top surface of the second surface dielectric layer BD2 of the second tier T2, the first surface dielectric layer BD1 of the first tier T1 and the second surface dielectric layer BD2 of the second tier T2 are pre-bonded. In other words, the first tier T1 and the second tier T2 are pre-bonded through the pre-bonding of the first surface dielectric layer BD1 and the second surface dielectric layer BD2. After pre-bonding, the first bonding connectors (BC0, BC1, BC2, BC3, and BC4) may respectively correspond to and may be in physical contact with the second bonding connectors (BE0, BE1, BE2, BE3, and BE4).

In some embodiments, after pre-bonding the first tier T1 and the second tier T2, a hybrid bonding of the first tier T1 and the second tier T2 is performed. The hybrid bonding of the first tier T1 and the second tier T2 may include a treatment for dielectric bonding to strengthen the bonding between the first surface dielectric layer BD1 and the second surface dielectric layer BD2, and a thermal annealing to facilitate the bonding between the first bonding connectors (BC0, BC1, BC2, BC3, and BC4) of the first tier T1 and the second bonding connectors (BE0, BE1, BE2, BE3, and BE4) of the second tier T2. In some embodiments, the process temperature of the thermal annealing for bonding connectors' bonding is higher than that of the treatment for dielectric bonding. Since the thermal annealing performing onto the first bonding connectors (BC0, BC1, BC2, BC3, and BC4) of the first tier T1 and the second bonding connectors (BE0, BE1, BE2, BE3, and BE4) of the second tier T2 is performed at relative higher temperature, metal diffusion and grain growth may occur at the bonding interface IF between the first bonding connectors (BC0, BC1, BC2, BC3, and BC4) of the first tier T1 and the second bonding connectors (BE0, BE1, BE2, BE3, and BE4) of the second tier T2. After the bonding of the first tier T1 and the second tier T2 is performed, the first bonding connectors (BC0, BC1, BC2, BC3, and BC4) and the second bonding connectors (BE0, BE1, BE2, BE3, and BE4) provide vertical electrical connections between the first tier T1 and the second tier T2, and the first interconnection structure 120 of the first tier T1 and the second interconnection structure 220 of the second tier T2 are in physical and electrical contact with each other through the first bonding connectors (BC0, BC1, BC2, BC3, and BC4) and the second bonding connectors (BE0, BE1, BE2, BE3, and BE4).

Figure 3B:
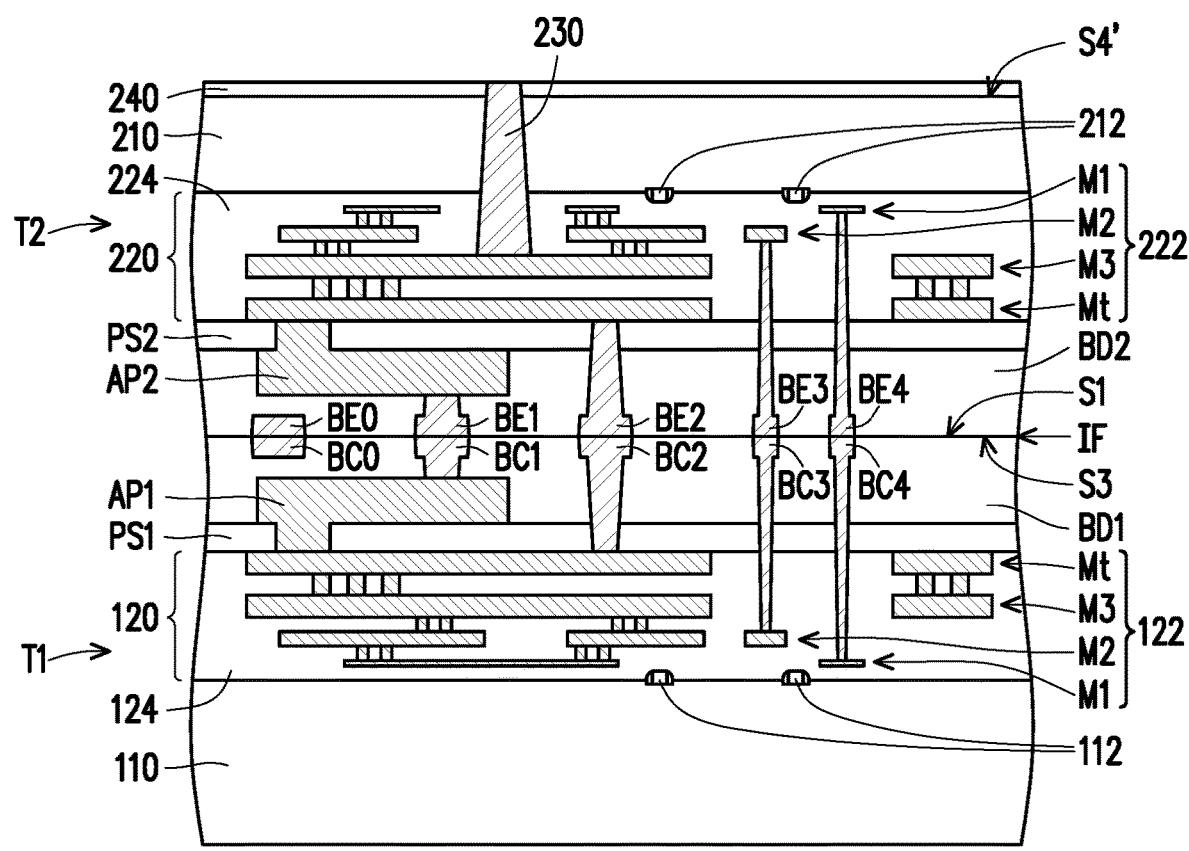

Referring to FIG. 3B, after bonding the first tier T1 and the second tier T2, a thinning process may be applied to the fourth surface S4 (labeled in FIG. 3A) of the second tier T2 to accessibly reveal the TSV 230. For example, the second semiconductor substrate 210 is thinned until the TSV 230 is exposed. In some embodiments, the TSV 230 may be slightly removed during the thinning process. The thinning process may include grinding, polishing, and/or etching, or other suitable techniques. In some embodiments, an isolation layer 240 is formed over the thinned fourth surface S4' of the second tier S2. For example, the isolation layer 240 includes an oxide formed through thermal oxidation of the second semiconductor substrate 210. In other embodiments, the isolation layer 240 is formed using a deposition process or other suitable techniques, and may include silicon oxide, silicon nitride, or the like. After formation, the TSV 230 may be at least laterally covered by the isolation layer 240.

Figure 3C:
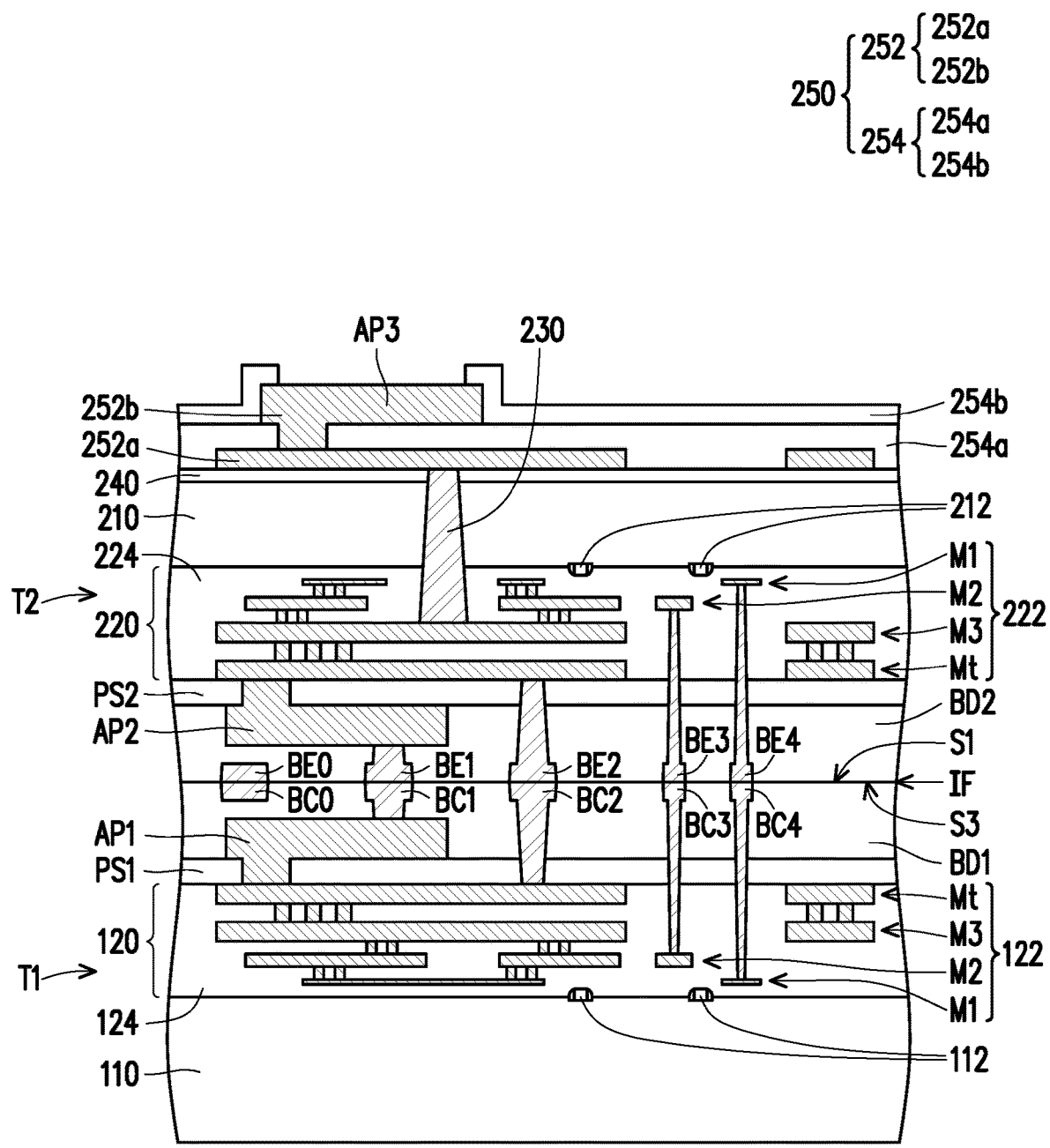

Referring to FIG. 3C, a redistribution structure 250 is formed on the isolation layer 240 and the TSV 230. The redistribution structure 250 may include at least one patterned dielectric layer 254 and at least one patterned conductive layer 252 (e.g., lines, vias, pads) disposed in the patterned dielectric layers 254. For example, the patterned conductive layer 252 and the patterned dielectric layer 254 may be formed using suitable depositing, patterning, and metallization techniques (e.g., dielectric deposition, lithography, etching, seed layer deposition, plating, planarization, etc.), or other suitable processes. It should be noted that although a two-layered redistribution structure is illustrated in FIG. 3C, the redistribution structure 250 may include more or less patterned conductive layer and patterned dielectric layer. The numbers of patterned conductive layer and patterned dielectric layer are not limited thereto.

The bottommost one of the patterned conductive layers 252a may be embedded in the bottommost one of the patterned dielectric layers 254a, and may be in physical and electrical contact with the underlying TSV 230. The TSV 230 may include slanted sidewalls connected to the second interconnect structure 220 and the redistribution structure 250. For example, the TSV 230 is tapered from the second interconnect structure 220 to the bottommost one of the patterned conductive layers 252a of the redistribution structure 250. The topmost one of the patterned conductive layers 252b may be accessibly revealed by the topmost one of the patterned dielectric layers 254. In some embodiments, the topmost one of the patterned conductive layers 252b includes an external contact pad AP3 for further electrical connection. The external contact pad AP3 may be the under-bump metallurgy (UBM) pad for the subsequent ball-mounting process. The external contact pad AP3 may include the material similar to the first contact pad AP1 or the second contact pad AP2. It should be noted that although only one external contact pad AP3 is illustrated, the number of the external contact pad AP3 is not limited in the disclosure.

In some embodiments, the topmost one of the patterned dielectric layers 254 may include one or more suitable passivation and/or protective materials in order to provide a degree of protection for the underlying conductive features. For example, the topmost one of the patterned dielectric layers 254 includes a passivation layer (e.g., a silicon oxide layer, a silicon nitride layer, combinations of these, or the like), a polymer layer (e.g., an epoxy, a polyimide layer, a benzocyclobutene (BCB) layer, a polybenzoxazole (PBO) layer, and the like), or a dielectric layer made from other suitable electrically insulating materials. The patterned conductive layer 252 of the redistribution structure 250 may redistribute the underlying circuity and may reroute the signal or power of the first and second tiers T1 and T2.

Figure 3D:
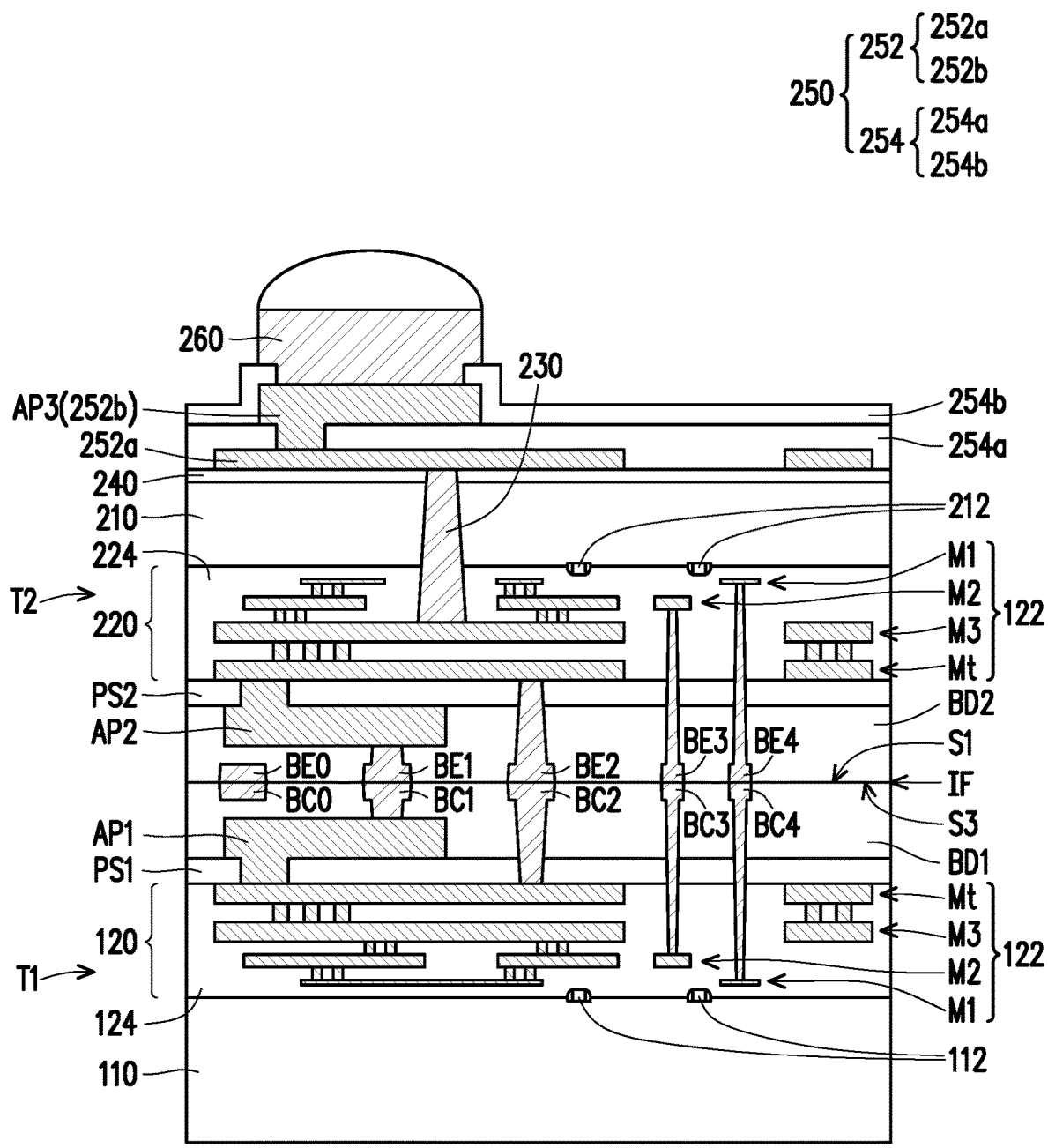

Referring to FIG. 3D, an external terminal 260 is formed on the redistribution structure 250. For example, a plurality of external terminals 260 (e.g., conductive balls) arranged in array are formed on the external contact pads AP3 of the topmost one of the patterned conductive layers 252b. In some embodiments, the external terminals 260 may be solder balls formed by ball placement and reflowing processes. In some other embodiments, the external terminals 260 may be or may include copper pillars, controlled collapse chip connection (C4) bumps, micro-bumps, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like. It should be noted that any suitable external terminals, and any suitable process for forming the external terminals, may be utilized for the external terminals 260.

In some embodiments, after forming the external terminal 260, a singulation process may be performed along scribe lines (not shown) to dice the resulted structure into a plurality of semiconductor structures 10. In some embodiments, the foregoing steps may be performed at wafer-to-wafer level, where the first tier T1 and the second tier T2 are provided in a wafer form for bonding, and after bonding, the bonded structure is singulated into multiple semiconductor structures 10. In other embodiments, the foregoing steps may be performed at the die-to-die level, or the die-to-wafer level, where at least one of the first tier T1 and the second tier T2 is singulated into a plurality of semiconductor dies (or chips) before bonding.

As shown in FIG. 3D, the semiconductor structures 10 includes the first tier T1 and the second tier T2 vertically stacked and integrated together. In some embodiments, the semiconductor structure 10 including integrated circuits may provide an entire system in one integrated circuit (IC) component. In some embodiments, the TSV 230 is used to provide short grounding paths for grounding the integrated circuits through the backside of the second tier T2, which may be covered by a grounded metallic film (not shown). It should be noted that the illustrated embodiment of pad-to-pad bonding (i.e. the trench portions of first bonding connectors (BC0, BC1, BC2, BC3, and BC4) are bonded to the trench portions of the second bonding connectors (BE0, BE1, BE2, BE3, and BE4)) shown in FIG. 3A to FIG. 3D is merely an example, the bonding connectors of the first tier T1 and/or the second tier T2 may be or may include conductive vias (e.g., copper vias), conductive pads (e.g., copper pads) or the combinations thereof. For example, the bonding between the first bonding connectors (BC0, BC1, BC2, BC3, and BC4) of the first tier T1 and the second bonding connectors (BE0, BE1, BE2, BE3, and BE4) of the second tier T2 may be via-to-via bonding, pad-to-pad bonding or via-to-pad bonding which will be described in greater detail below in other embodiments.

Figure 4:
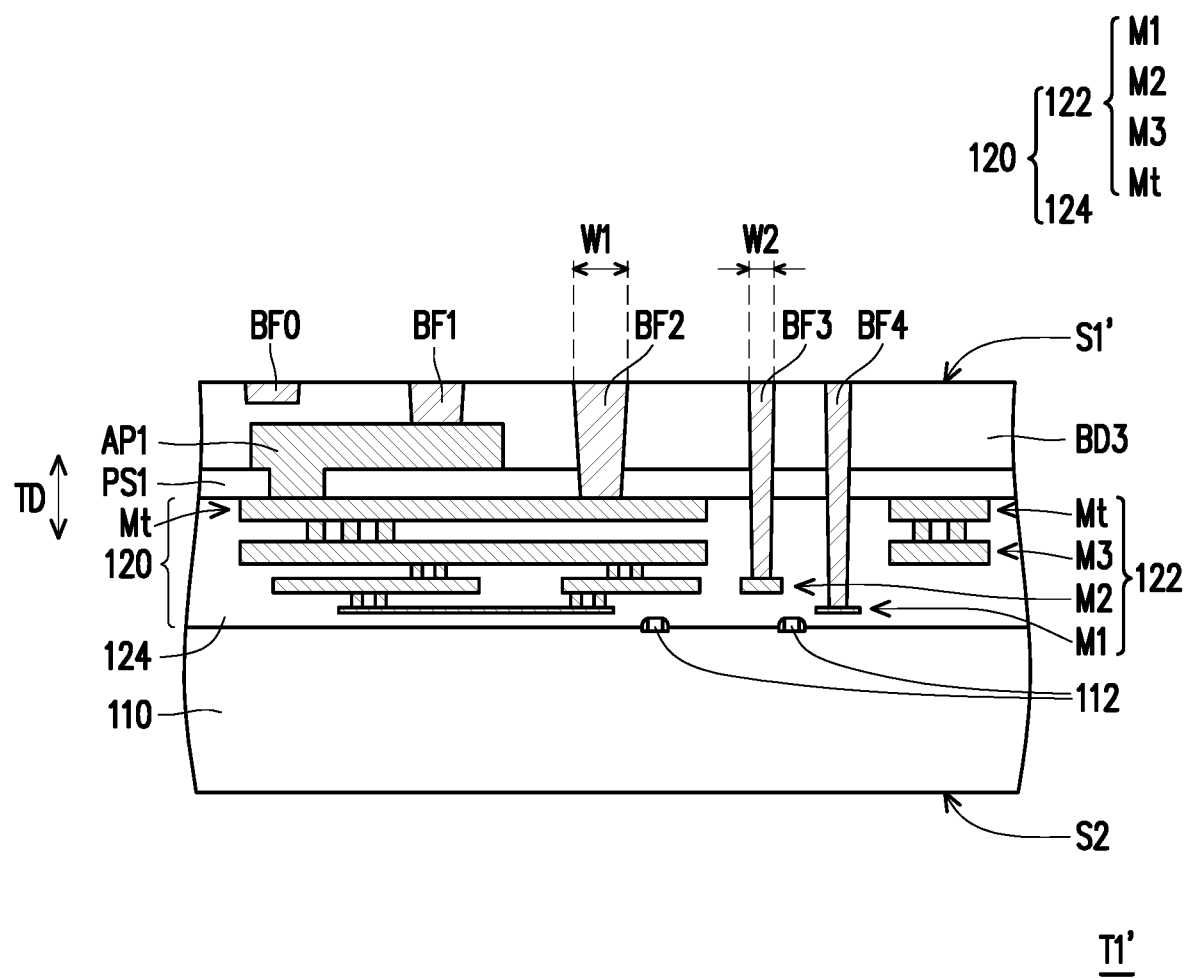
FIG. 4 is a schematic cross-sectional view showing a first tier of a semiconductor structure according to some embodiments of the present disclosure.

FIG. 4 is a schematic cross-sectional view showing a first tier of a semiconductor structure according to some embodiments of the present disclosure. Referring to FIG. 4, a first tier T1' is similar to the first tier T1 shown in FIG. 1C, and the difference therebetween lies in the first bonding connectors. Like elements throughout the drawings are designated with the same reference numbers for ease of understanding and the details thereof are not repeated herein. For example, a plurality of via openings (not shown) is formed on the first surface dielectric layer BD3 of the first tier T1', and no trench is formed on the first surface dielectric layer BD3. In some embodiments, at least a portion of the via openings may extend downwardly into the first interconnect structure 120 using a single damascene process or other suitable techniques. Next, conductive materials are formed in the via openings to form a plurality of first bonding connectors (e.g., BF0, BF1, BF2, BF3, and BF4). In some embodiments, the first bonding connectors (BF0, BF1, BF2, BF3, and BF4) having slanted sidewalls and may be tapered in a thickness direction TD of the first tier T1' from the first surface S1' toward the second surface S2. Alternatively, each first bonding connector (e.g., BF0, BF1, BF2, BF3, and BF4) includes substantially vertical sidewalls.

In some embodiments, some of the first bonding connectors (e.g., BF3, BF4) are in physical and electrical contact with the first interconnecting layer(s) 122 beneath the top interconnecting layer Mt. In some embodiments, some of the first bonding connectors (e.g., BF1, BF2) are in physical and electrical contact with the first contact pad AP1 and/or the top interconnecting layer Mt, and other first bonding connectors (e.g., BF0) may serve as dummy connectors. In some embodiments, the first bonding connectors (e.g., BF3, BF4) connected to the first interconnecting layer(s) 122 beneath the top interconnecting layer Mt have the same or similar top width. The top widths of the rest of the first bonding connectors (e.g., BF0, BF1, BF2) may be the same or similar to one another, but may be different from the top widths of the first bonding connectors (e.g., BF3, BF4) connected to the first interconnecting layer(s) 122 beneath the top interconnecting layer Mt. Taking the first bonding connectors BF2 and BF3 for example, the top width W1 of the first bonding connector BF2 is greater than the top width W2 of the first bonding connector BF3, and the first bonding connectors BF3 extends further than the first bonding connector BF2 from the first surface S1' of the first tier T1'. In some embodiments, the top width W1 of the first bonding connector BF2 is in a range of about 0.3 µm to about 4.5 µm. In some embodiments, the top width W2 of the first bonding connector BF3 is in a range of about 0.1 µm to about 2.5 µm. The first bonding connector BF3 may be finer and longer than the first bonding connector BF2. In some embodiments, the aspect ratio (height/top width) of the first bonding connector BF3 is about 0.3 to about 20.

In some embodiments, the first tier T1' is bonded to the second tier T2 as shown in FIG. 2D in a face-to-face configuration to form a bonded structure with via-to-pad bonding (i.e. the first bonding connectors (BF0, BF1, BF2, BF3, and BF4) are bonded to the trench portions of the second bonding connectors (BE0, BE1, BE2, BE3, and BE4)), and then the bonded structure may be processed to form a semiconductor structure (not shown). In other embodiments, two of the first tier T1' may be bonded together in a face-to-face configuration to form a bonded structure with via-to-via bonding (i.e. the first bonding connectors of one of the first tier T1' are bonded to the first bonding connectors of the other one of the first tier T1'), and then the TSV, the redistribution structure, and the external terminal may be formed on at least one of the first semiconductor substrate to provide electrical connections to external component(s). It should be noted that any number of the first tier T1 or T1' and/or the second tier T2 may be stacked vertically in any combination depending on the design requirements, and different tiers may be electrically communicated to one another through at least the bonding connectors, the TSVs, and other conductive features.

Figure 5A:
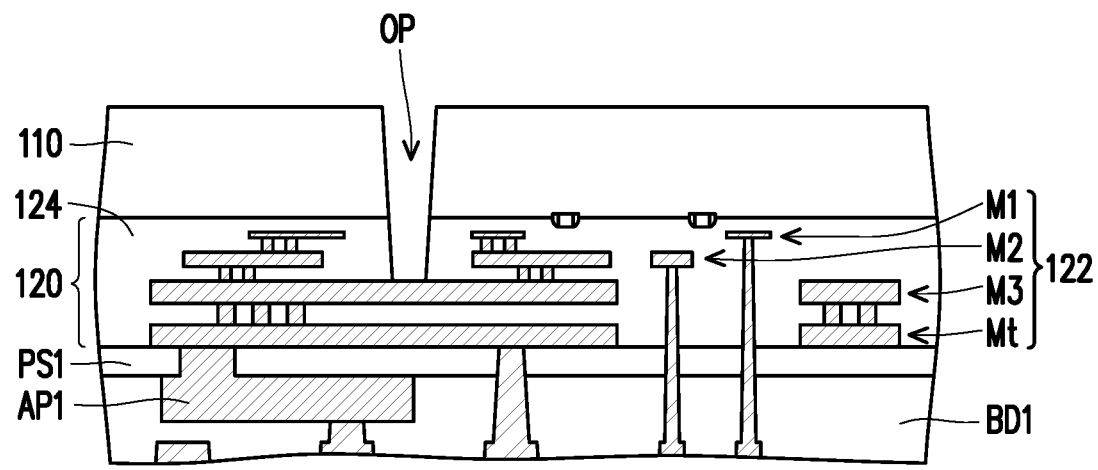
FIG. 5A to FIG. 5C are schematic, partial cross-sectional views showing various stages in a manufacturing method of a semiconductor structure according to some embodiments of the present disclosure.
Figure 5B:
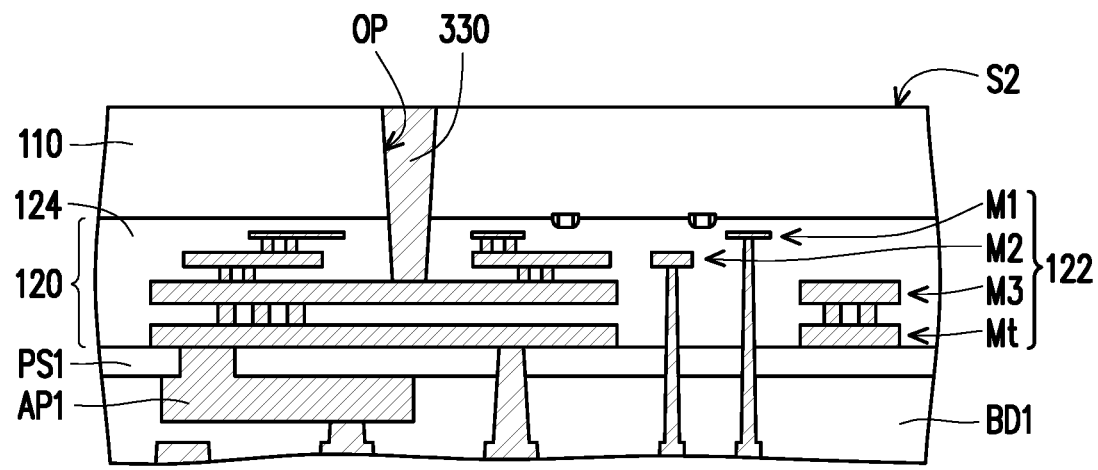
Figure 5C:
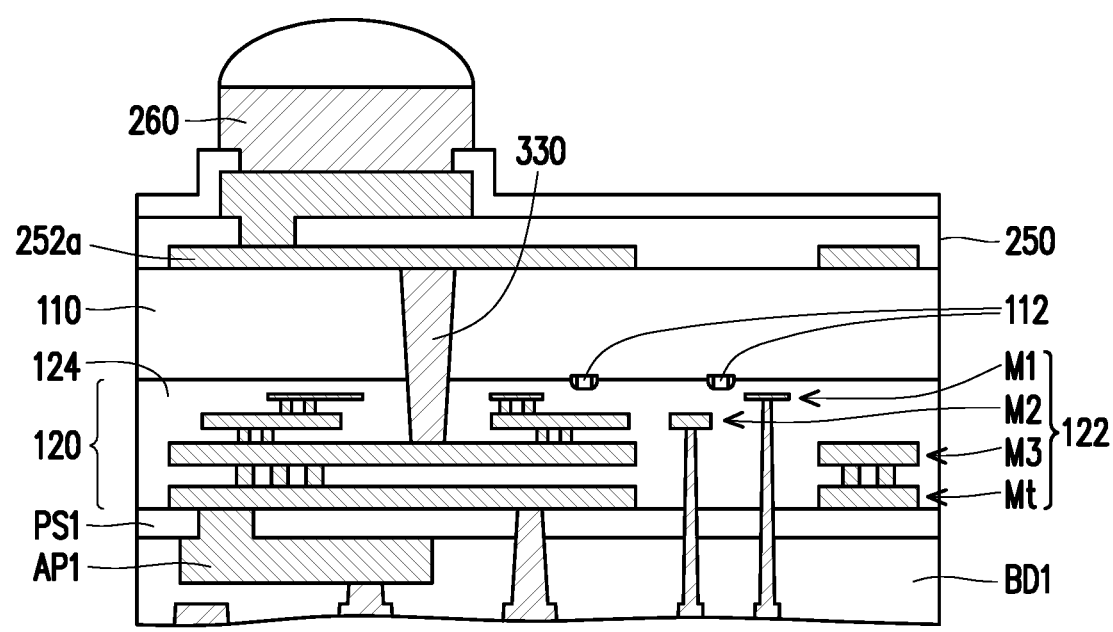

FIG. 5A to FIG. 5C are schematic, partial cross-sectional views showing various stages in a manufacturing method of a semiconductor structure according to some embodiments of the present disclosure. It should be noted that FIG. 5A to FIG. 5C only show a portion of the structure. For example, two of the first tiers T1 shown in FIG. 1C (or two of the first tiers T1' shown in FIG. 4) may be formed and then bonded together in a face-to-face configuration to form a bonded structure, and FIG. 5A to FIG. 5C may illustrate one of first tiers T1 (or the first tiers T1' shown in FIG. 4) of the bonded structure. In some embodiments, the first tier T1 and the second tier T2 may be bonded together to form a bonded structure as shown in FIG. 3A, and FIG. 5A to FIG. 5C may illustrate the first tier T1 of the bonded structure after overturning (e.g., flip upside down) the bonded structure. Alternatively, the first tier T1 of the bonded structure may be replaced by the first tier T1' as shown in FIG. 4. It should be noted that the bonded structure may include more than two tiers stacked on and bonded to one another, and the number of stacking tiers of the bonded structure is not limited in the disclosure.

Referring to FIG. 5A and FIG. 5B, an opening OP is formed on the first semiconductor substrate 110. For example, the opening OP passes through the first semiconductor substrate 110 and extends downwardly to the first interconnect structure 120 to accessibly expose the first interconnecting layer 122. The opening OP may be tapered from the first semiconductor substrate 110 to the first interconnecting layers 122. Alternatively, the opening OP may include a substantially vertical sidewall. It should be noted that the opening OP may extend to expose any level of the first interconnecting layers 122 depending on the design requirements, and the illustration of FIG. 5A is merely an example. Subsequently, conductive materials are formed in the opening OP to form the TSV 330. For example, the TSV 330 is in physical and electrical contact with any level of the first interconnecting layers 122. The material of the TSV 330 may be similar to that of the TSV 230 as described in FIG. 2B, so the detailed descriptions are omitted for brevity. For example, the conductive materials may be formed using plating, printing, or other suitable depositing process, and then excess material may be removed using such as a CMP process, so that the TSV 330 may be substantially leveled with the second surface S2 of the first semiconductor substrate 110.

Referring to FIG. 5C, the redistribution structure 250 is formed on the second surface S2 of the first semiconductor substrate 110 and the TSV 330, and then the external terminal 260 is formed on the redistribution structure 250. The bottommost one of the patterned conductive layers 252a of the redistribution structure 250 may be in physical and electrical contact with the TSV 330. The redistribution structure 250 and the external terminal 260 may be electrically coupled to the first interconnect structure 120 through the TSV 330. In some embodiments, the TSV 330 may have slanted sidewalls and may be tapered from the bottommost one of the patterned conductive layers 252a to the first interconnecting layers 122. The forming processes and the materials of the redistribution structure 250 and the external terminal 260 may be similar to those of the redistribution structure 250 and the external terminal 260 described in FIG. 3C and FIG. 3D, so the detailed descriptions are omitted for brevity. After forming the redistribution structure 250 and the external terminal 260, a singulation process may be performed along scribe lines (not shown) to dice the resulted structure into a plurality of semiconductor structures 20.

Figure 6:
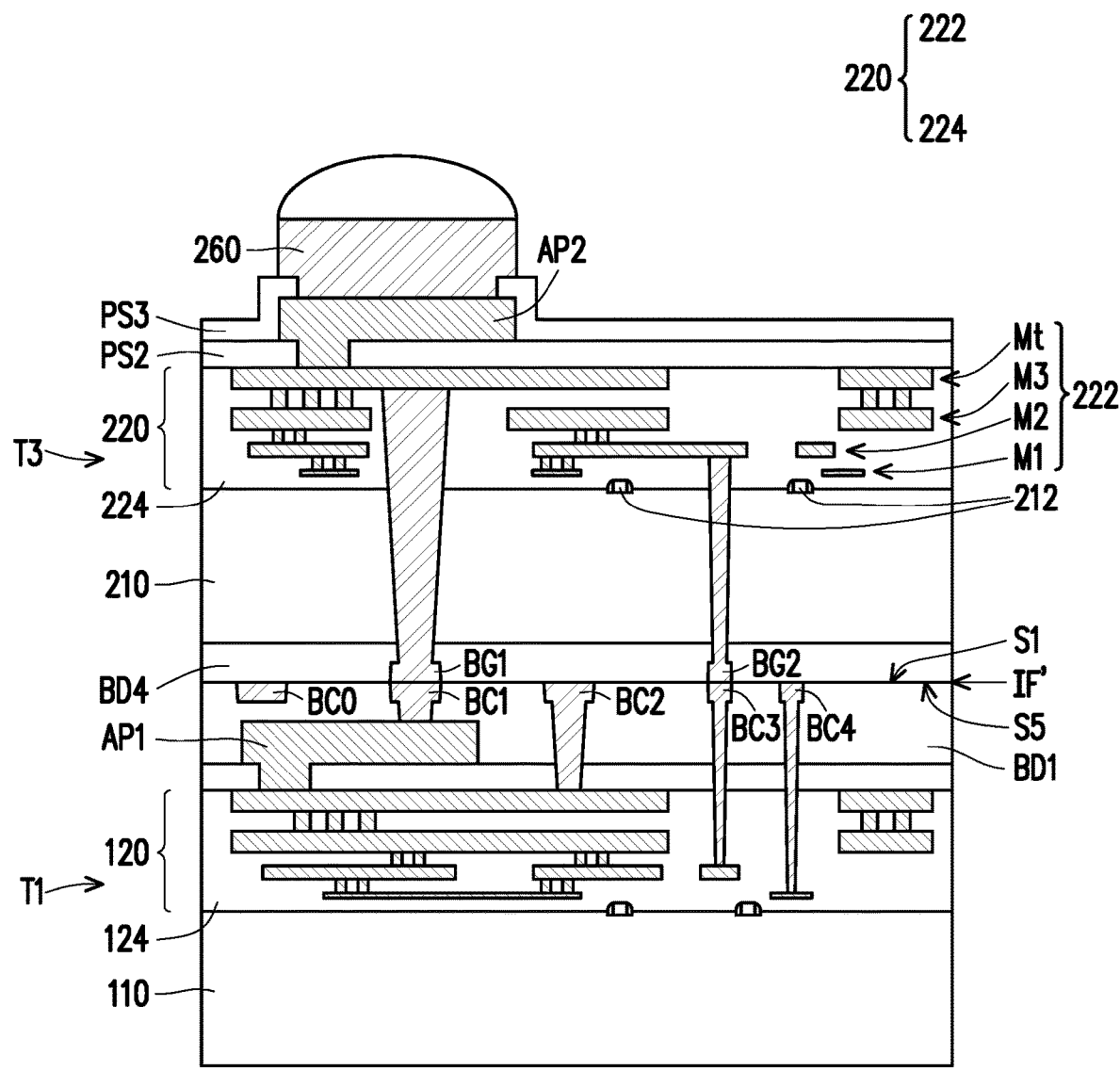
FIG. 6 is a schematic cross-sectional view showing a semiconductor structure according to some embodiments of the present disclosure.

FIG. 6 is a schematic cross-sectional view showing a semiconductor structure according to some embodiments of the present disclosure. Referring to FIG. 6, a semiconductor structure 30 including the first tier T1 and a third tier T3 stacked thereon is provided. In some embodiments, the first tier T1 and the third tier T3 are bonded together in a face-to-back configuration. For example, the third tier T3 includes the second semiconductor substrate 210 including the second semiconductor devices 212, the second interconnect structure 220 formed on the second semiconductor substrate 210 and electrically coupled to the second semiconductor substrate 210, and the second contact pad AP2 being in physical and electrical contact with the top interconnecting layer Mt. In some embodiments, the third tier T3 includes a third surface dielectric layer BD4 formed on the second semiconductor substrate 210 opposite to the second interconnect structure 220, and a plurality of third bonding connectors (e.g., BG0, BG1, and BG2) penetrating through the third surface dielectric layer BD4 and the second semiconductor substrate 210 to be in physical and electrical contact with the second interconnecting layers 222 of the second interconnect structure 220. For example, the third bonding connector BG1 extends from the bonding interface IF' between the first tier T1 and the third tier T3, passes through the second semiconductor substrate 210, and extends into the second dielectric layers 224 to reach the top interconnecting layer Mt of the second interconnecting layers 222. In some embodiments, the third bonding connector BG2 extends from the bonding interface IF', passes through the second semiconductor substrate 210, and extends into the second dielectric layers 224 to reach the intermediate level of the second interconnecting layers 222 (e.g., the second-level interconnecting layer M2) or the bottom interconnecting layer M1 of the second interconnecting layers 222. The third bonding connector BG1 may extend further than the third bonding connector BG2 from the bonding interface IF'. In some embodiments, the third bonding connectors BG1 and BG2 are correspondingly bonded to the first bonding connectors BC1 and BC4 which may respectively serve as power and signal connectors.

It should be appreciated that the third bonding connectors (e.g., BG1, BG2) may be in contact with any level of the second interconnecting layers 222 depending on the product requirements, and the configuration of the third bonding connectors illustrated in FIG. 6 is merely an example. The number of the third bonding connectors (e.g., BG0, BG1, and BG2) may or may not correspond to that of the first bonding connectors (e.g., BC0, BC1, BC2, BC3, and BC4) of the first tier T1. The third bonding connectors (e.g., BG0, BG1, and BG2) may be formed after forming the third surface dielectric layer BD4. In other embodiments, portions of the third bonding connectors (e.g., BG0, BG1, and BG2) passing through the second semiconductor substrate 210 and extending into the second interconnect structure 220 may be formed prior to portions of the third bonding connectors (e.g., BG0, BG1, and BG2) laterally embedded in the third surface dielectric layer BD4.

In some embodiments, the first tier T1 and the third tier T3 are arranged with the first surface S1 of the first tier T1 and the fifth surface S5 of the third tier T3 facing each other and are bonded. The third bonding connectors (e.g., BG0, BG1, and BG2) and the third surface dielectric layer BD4 may be substantially leveled at the fifth surface S5 of third tier T3. In some embodiments, the bonding interface IF' between the first tier T1 and the third tier T3 includes dielectric-todielectric bonding (e.g., oxide-to-oxide bonding), metal-to-metal bonding (e.g., copper-to-copper bonding), metal-to-dielectric bonding (e.g., oxide-to-copper bonding), any combinations thereof, and/or the like. The bonding interface IF' may be located between the first surface dielectric layer BD1 of the first tier T1 and the third surface dielectric layer BD4 of the third tier T3. The first surface dielectric layer BD1 of the first tier T1 and the third surface dielectric layer BD4 of the third tier T3 may be located between first interconnect structure 120 of the first tier T1 and the second semiconductor substrate 210 of the third tier T3.

In some embodiments, the second contact pad AP2 electrically connected to the top interconnecting layer Mt of the second interconnecting layers 222 may serve as the external pad, and the external terminal 260 may be formed on the second contact pad AP2. For example, a third passivation layer PS3 formed on the second passivation layer PS2 may accessibly reveal at least a portion of the second contact pad AP2 for the subsequently formed external terminal 260. The external terminal 260 may be electrically coupled to the second semiconductor devices 212 through the second contact pad AP2 and the second interconnecting layers 222. In some embodiments the power or electrical signal of the first tier T1 may be transmitted to the external terminal 260 through the third bonding connectors (e.g., BG1, BG2), the second interconnecting layers 222, and the second contact pad AP2. It should be appreciated that the semiconductor structure 30 may include more than two tiers, and bonding connectors and/or TSVs may be used to provide vertical electrical connections between two adjacent tiers.

Figure 7:
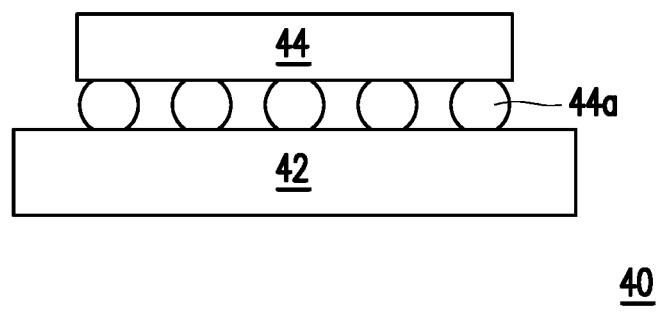
FIG. 7 is a schematic cross-sectional view showing an application of a semiconductor structure according to some embodiments of the present disclosure.

FIG. 7 is a schematic cross-sectional view showing an application of a semiconductor structure according to some embodiments of the present disclosure. Referring to FIG. 7, a structure 40 including a first component 42 and a second component 44 disposed over the first component 42 is provided. The first component 42 may be or may include a printed circuit board (PCB), a printed wiring board, interposer, package substrate, and/or other carrier that is capable of carrying integrated circuits. In some embodiments, the second component 44 mounted on the first component 42 is similar to the semiconductor structure 10, 20, or 30 described above in conjunction with FIGS. 3D, 5C, and 6, respectively. For example, the semiconductor structure 10, 20, or 30 may be electrically coupled to the first component 42 through the plurality of terminals 44a (e.g., external terminals 260). In some other embodiments, the second component 44 mounted on the first component 42 may be an integrated fan-out (InFO) package including at least one semiconductor structure (e.g., semiconductor structure 10, 20, or 30 described above in conjunction with FIGS. 3D, 5C, and 6) packaged therein. For example, the second component 44 may include a plurality of semiconductor structures (e.g., any combinations of semiconductor structure 10, 20, or 30 described above in conjunction with FIGS. 3D, 5C, and 6) separately and laterally encapsulated by an insulating encapsulation (not shown), a fan-out redistribution structure (not shown) may be formed on the insulating encapsulation and these semiconductor structures so as to be electrically coupled to these semiconductor structures, and a plurality of terminals 44a formed on the fan-out redistribution structure to be electrically coupled to the fan-out redistribution structure and the first component 42. Other packaging techniques may be used, which are not limited in the disclosure. The structure 40 may be part of an electronic system for such as computers (e.g., high-performance computer (HPC)), computational devices used in conjunction with an artificial intelligence (AI) system, wireless communication devices, computer-related peripherals, entertainment devices, etc. It should be noted that other applications are possible.

In accordance with some embodiments of the disclosure, a semiconductor structure including a semiconductor substrate, a plurality of interconnecting layers, a first connector, and a second connector is provided. The semiconductor substrate includes a plurality of semiconductor devices therein. The interconnecting layers are disposed over the semiconductor substrate and electrically coupled to the semiconductor devices. The first connector is disposed over the plurality of interconnecting layers and extends to be in contact with a first level of the plurality of interconnecting layers. The second connector is disposed over the plurality of interconnecting layers and substantially leveled with the first connector. The second connector extends further than the first connector to be in contact with a second level of the plurality of interconnecting layers between the first level of the plurality of interconnecting layers and the semiconductor substrate, and the first connector is wider than the second connector.

In accordance with some embodiments of the disclosure, a semiconductor structure including a first semiconductor die and a second semiconductor die stacked on and bonded to the first semiconductor die is provided. The first semiconductor die includes a first bonding connector and a second bonding connector. A ratio of height to width of the second bonding connector is greater than that of the first bonding connector. The second semiconductor die includes a third bonding connector bonded to the first bonding connector of the first semiconductor die, and a fourth bonding connector bonded to the second bonding connector of the first semiconductor die. The dimensions of the third bonding connector and the fourth bonding connector respectively correspond to those of the first bonding connector and the second bonding connector.

In accordance with some embodiments of the disclosure, a manufacturing method of a semiconductor structure includes at least the following steps. A first surface dielectric layer is formed on a first interconnect structure over a first semiconductor substrate. A first via opening and a second via opening are formed, where the second via opening penetrates through the first surface dielectric layer and extends further than the first via opening to accessibly reveals at least a portion of the first interconnect structure, and the second via opening is narrower than the first via opening. A conductive material is formed in the first via opening and the second via opening to correspondingly form a first bonding connector and a second bonding connector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
a semiconductor substrate comprising a plurality of semiconductor devices therein;

a plurality of interconnecting layers disposed over the semiconductor substrate and electrically coupled to the semiconductor devices;

a first connector disposed over the plurality of interconnecting layers and extending to be in contact with a first level of the plurality of interconnecting layers;

a second connector disposed over the plurality of interconnecting layers and substantially leveled with the first connector, the second connector extending further than the first connector to be in contact with a second level of the plurality of interconnecting layers between the first level of the plurality of interconnecting layers and the semiconductor substrate, and the first connector being wider than the second connector; and a through semiconductor via (TSV) penetrating through the semiconductor substrate to be in contact with one of the plurality of interconnecting layers, the TSV being electrically coupled to the semiconductor devices of the semiconductor substrate through the plurality of interconnecting layers, wherein a top surface of the TSV is located between top surfaces of the semiconductor substrate and the first level of the plurality of interconnecting layers.

2. The semiconductor structure of claim 1, further comprising:

a contact pad disposed over the first level of the plurality of interconnecting layers and electrically coupled to the semiconductor devices of the semiconductor substrate through the plurality of interconnecting layers.

3. The semiconductor structure of claim 2, further comprising:

a third connector, a top surface of the third connector being substantially leveled with a top surface of the first connector and a top surface of the second connector, and the third connector extending to be in contact with the contact pad.

4. The semiconductor structure of claim 3, wherein an aspect ratio of the third connector is less than that of the second connector.

5. The semiconductor structure of claim 1, wherein an aspect ratio of the second connector is in a range of about 0.3 to about 20.

6. The semiconductor structure of claim 1, further comprising:

a contact pad electrically coupled to the plurality of semiconductor devices through the plurality of interconnecting layers, wherein the contact pad is vertically disposed above a bottom surface of the first connector and the first level of the plurality of interconnecting layers, and the bottom surface of the first connector is located between the contact pad and the first level of the plurality of interconnecting layers.

7. The semiconductor structure of claim 1, wherein the through semiconductor via is tapered from the one of the plurality of interconnecting layers to the semiconductor substrate.

8. A semiconductor structure, comprising:

a first semiconductor die comprising:

a first semiconductor substrate comprising a plurality of first semiconductor devices therein;

a first bonding connector and a second bonding connector, a ratio of height to width of the second bonding connector being greater than that of the first bonding connector;

a plurality of first interconnecting layers disposed over the first semiconductor substrate, and the first bonding connector and the second bonding connector being electrically coupled to the plurality of first semiconductor devices through the plurality of first interconnecting layers; and a through semiconductor via (TSV) extending from one of the plurality of first interconnecting layers to the first semiconductor substrate, wherein a top surface of the TSV is located between a bottom surface of the first bonding connector and a top surface of the first semiconductor substrate; and a second semiconductor die stacked on and bonded to the first semiconductor die, the second semiconductor die comprising a third bonding connector bonded to the first bonding connector of the first semiconductor die, and a fourth bonding connector bonded to the second bonding connector of the first semiconductor die, wherein dimensions of the third bonding connector and the fourth bonding connector respectively correspond to those of the first bonding connector and the second bonding connector.

9. The semiconductor structure of claim 8, wherein the first bonding connector of the first semiconductor die is substantially leveled with the second bonding connector of the first semiconductor die at a bonding interface between the first semiconductor die and the second semiconductor die.

10. The semiconductor structure of claim 9, wherein the first bonding connector and the second bonding connector extend in a thickness direction of the first semiconductor die, and the second bonding connector extends further than the first bonding connector from the bonding interface.

11. The semiconductor structure of claim 8, wherein the first bonding connector is disposed over the plurality of first interconnecting layers and extends from a bonding interface between the first semiconductor die and the second semiconductor die to a first level of the plurality of first interconnecting layers.

12. The semiconductor structure of claim 11, wherein the second bonding connector of the first semiconductor die is disposed over the plurality of first interconnecting layers and extends from the bonding interface to a second level of the plurality of first interconnecting layers between the first semiconductor substrate and the first level of the plurality of first interconnecting layers.

13. The semiconductor structure of claim 8, wherein the first semiconductor die further comprises:

a contact pad disposed over the plurality of first interconnecting layers, wherein the first bonding connector lands on a first level of the plurality of first interconnecting layers, and a bottom surface of the first bonding connector is located between top surfaces of the contact pad and the first level of the plurality of first interconnecting layers.

14. The semiconductor structure of claim 8, wherein the first semiconductor die further comprises:

an external contact pad disposed over the first semiconductor substrate opposite to the plurality of first interconnecting layers and electrically coupled to the through semiconductor via; and an external terminal disposed on and electrically coupled to the external contact pad.

15. The semiconductor structure of claim 11, wherein the second semiconductor die further comprises:

a second semiconductor substrate comprising a plurality of second semiconductor devices therein; and a plurality of second interconnecting layers disposed over the second semiconductor substrate and electrically coupled to the second semiconductor devices, wherein the bonding interface between the first semiconductor die and the second semiconductor die is between the second semiconductor substrate of the second semiconductor die and the first level of the plurality of first interconnecting layers of the first semiconductor die.

16. The semiconductor structure of claim 15, wherein the second semiconductor substrate of the second semiconductor die and the plurality of first interconnecting layers of the first semiconductor die are located between the plurality of second interconnecting layers of the second semiconductor die and the first semiconductor substrate of the first semiconductor die, and the third bonding connector and the fourth bonding connector of the second semiconductor die penetrate through the second semiconductor substrate to be in contact with one of the plurality of second interconnecting layers.

17. A semiconductor structure, comprising:
a first semiconductor die comprising:
  a first semiconductor substrate comprising a plurality of first semiconductor devices therein;
  a plurality of first interconnecting layers stacked upon the first semiconductor substrate and electrically coupled to the plurality of first semiconductor devices;
  a first bonding connector and a second bonding connector respectively landing on a first level and a second level of the plurality of first interconnecting layers, wherein the second level is between the first level and the first semiconductor substrate, and the second bonding connector is narrower than the first bonding connector; and
a second semiconductor die stacked upon the first semiconductor die and comprising:
  a second semiconductor substrate comprising an active side, a rear side opposite to the active side and facing the first semiconductor die, a plurality of second semiconductor devices disposed at the active side;
  a plurality of second interconnecting layers stacked upon the first semiconductor substrate and electrically coupled to the plurality of second semiconductor devices; and
  a first through semiconductor via (TSV) and a second TSV respectively extending from the plurality of second interconnecting layers and passing through the second semiconductor substrate to reach the first semiconductor die, wherein a top surface of the second TSV is between a top surface of the first TSV and the active side of the second semiconductor substrate, and a bottom surface of the second TSV is bonded to the second bonding connector of the first semiconductor die.

18. The semiconductor structure of claim 17, wherein the first semiconductor die further comprises:
  a contact pad disposed over the first level of the plurality of first interconnecting layers; and
  a third bonding connector comprising a top surface bonded to the first TSV of the second semiconductor die, and a bottom surface landing on the contact pad, wherein the top surface of the third bonding connector is substantially leveled with top surfaces of the first bonding connector and the second bonding connector.

19. The semiconductor structure of claim 17, wherein the first TSV and the second TSV are respectively connected to a first level and a second level of the plurality of second interconnecting layers, and the second level is between the first level and the second semiconductor substrate.

20. The semiconductor structure of claim 19, wherein:
  the first semiconductor die further comprises a first bonding dielectric layer disposed on the plurality of first interconnecting layers and laterally covering the first bonding connector and the second bonding connector, and
  the second semiconductor die further comprises a second bonding dielectric layer disposed on the rear side of the second semiconductor substrate and laterally covering the first TSV and the second TSV, and the second bonding dielectric layer being bonded to the first bonding dielectric layer.

* * * * *